(12) United States Patent
Fang et al.

(10) Patent No.: US 12,140,332 B2
(45) Date of Patent: Nov. 12, 2024

(54) OPTIMIZED REGULATING AND CONTROLLING METHOD AND SYSTEM FOR INTEGRATED ELECTRICITY AND HEAT SYSTEM WITH HEAT PUMPS

(71) Applicant: North China Electric Power University, Beijing (CN)

(72) Inventors: Fang Fang, Beijing (CN); Shunping Jin, Beijing (CN); Xinmeng Zhong, Beijing (CN); Jizhen Liu, Beijing (CN); Yang Hu, Beijing (CN)

(73) Assignee: North China Electric Power University, Beijing (CN)

( * ) Notice: Subject to any disclaimer, the term of this patent is extended or adjusted under 35 U.S.C. 154(b) by 559 days.

(21) Appl. No.: 17/472,866

(22) Filed: Sep. 13, 2021

(65) Prior Publication Data

US 2022/0074620 A1 Mar. 10, 2022

Related U.S. Application Data

(63) Continuation-in-part of application No. PCT/CN2021/080499, filed on Mar. 12, 2021.

(30) Foreign Application Priority Data

Sep. 4, 2020 (CN) .......................... 202010922508.2

(51) Int. Cl.
*F24F 11/63* (2018.01)
*F24F 11/46* (2018.01)
(Continued)

(52) U.S. Cl.
CPC .............. *F24F 11/63* (2018.01); *F24F 11/46* (2018.01); *G05B 13/042* (2013.01); *G06F 30/25* (2020.01);
(Continued)

(58) Field of Classification Search
CPC ........ F24F 11/63; F24F 11/46; F24F 2140/60; G05B 13/042; G06F 30/25; G06F 30/20;
(Continued)

(56) References Cited

U.S. PATENT DOCUMENTS

| 9,130,970 B2 | 9/2015 | Carney et al. |
| 2017/0193125 A1 | 7/2017 | Weisman et al. |
| 2020/0176989 A1 | 6/2020 | Zhang et al. |

FOREIGN PATENT DOCUMENTS

| CN | 107017619 A | 8/2017 |
| CN | 107844055 A * | 3/2018 |

(Continued)

OTHER PUBLICATIONS

Jin Shunping, "Game Analysis of Microgrid Capacity Allocation Considering the Constraint of Power Shortage under Different Investment Modes," China Electric Power, vol. 53, No. 8, Aug. 2020, pp. 173-181.

(Continued)

*Primary Examiner* — Rehana Perveen
*Assistant Examiner* — Troy A Maust
(74) *Attorney, Agent, or Firm* — NKL Law; Allen Xue

(57) ABSTRACT

The present application provides an optimized regulating and controlling method and system for an integrated electricity and heat system with heat pumps, relating to the technical field of energy operation. According to the present application, regulating and controlling can be performed by regarding units as different agents and taking maximization of the self-interest of each agent as the objective, so that the load demands of heat and power consumers can be met, and each unit agent can be satisfied with its payoff to the greatest extent. The method includes: S1. establishing a composition and structure framework of the integrated electricity and heat system with heat pumps, and establishing an output (Continued)

model of each unit; S2. establishing a payoff function model of each unit in the integrated electricity and heat system with heat pumps; S3. establishing a non-cooperative game model of the integrated electricity and heat system with heat pumps; and S4. solving the game model by using a particle swarm optimization algorithm to obtain a heat and power scheduling optimization scheme of each unit. The technical solution provided by the present application is applicable to a process of regulating an integrated electricity and heat system with heat pumps.

3 Claims, 11 Drawing Sheets

(51) Int. Cl.

| | | |
|---|---|---|
| G05B 13/04 | (2006.01) | |
| G06F 30/25 | (2020.01) | |
| G06Q 10/04 | (2023.01) | |
| G06Q 10/0631 | (2023.01) | |
| G06Q 50/06 | (2024.01) | |
| H02J 3/32 | (2006.01) | |
| H02J 3/38 | (2006.01) | |
| H02J 3/46 | (2006.01) | |
| F24F 140/60 | (2018.01) | |
| G06Q 10/20 | (2023.01) | |

(52) U.S. Cl.
CPC ....... *G06Q 10/04* (2013.01); *G06Q 10/06313* (2013.01); *G06Q 50/06* (2013.01); *H02J 3/32* (2013.01); *H02J 3/381* (2013.01); *H02J 3/466* (2020.01); *F24F 2140/60* (2018.01); *G06Q 10/20* (2013.01); *H02J 2203/20* (2020.01); *H02J 2300/24* (2020.01); *H02J 2300/28* (2020.01)

(58) Field of Classification Search
CPC .. G06F 30/23; G06Q 10/04; G06Q 10/06313; G06Q 50/06; G06Q 10/20; G06Q 50/00; H02J 3/32; H02J 3/381; H02J 3/466; H02J 2203/20; H02J 2300/24; H02J 2300/28; H02J 2310/56; H02J 3/14; Y02B 70/30; Y02B 70/3225; Y04S 20/222; Y04S 20/244; Y02E 10/56
See application file for complete search history.

(56) References Cited

FOREIGN PATENT DOCUMENTS

| CN | 108629470 A | | 10/2018 | |
|---|---|---|---|---|
| CN | 109657946 A | | 4/2019 | |
| CN | 109687532 A | * | 4/2019 | ....... G06Q 10/06312 |
| CN | 110322154 A | | 10/2019 | |
| CN | 110458353 A | | 11/2019 | |
| CN | 111008739 A | | 4/2020 | |
| CN | 112069734 A | | 12/2020 | |
| CN | 109657946 B | * | 1/2024 | ......... G06Q 10/0631 |
| WO | WO-2012/097030 A1 | | 7/2012 | |
| WO | WO-2020/123537 A1 | | 6/2020 | |

OTHER PUBLICATIONS

Zhu Zhongyan, "Research on Coordination Optimization of Regional Integrated Energy System Based on Game Theory" for North China Electric Power University, Chinese Excellent Doctoral and Master's Full-text Database (Master) Basic Science Series, vol. 2020 No. 01, Mar. 2019, 73 pages, with English abstract (pp. 1, 2, 73).

Zhou Yutong, "Research on Optimal Configuration of Integrated Energy Microgrid" for North China Electric Power University, China Excellent Doctoral and Master's Essays Full-text Database (Master) Engineering Science II Series, vol. 2020 No. 01, Mar. 2019, 65, with English abstract (pp. 1, 2, 65, 66).

Dong Haiying et al., "Peak Regulation Strategy of CSP Plants Based on Operation Mode of Cogeneration," ACTA Energiae Solaris Sinica, vol. 40 No. 10, Oct. 2019, pp. 2763-2772, with English abstract (p. 2772).

Mei Shengwei, "A Game Theory Based Planning Model and Analysis for Hybrid Power System with Wind Generators-Photovoltaic Panels-Storage Batteris," Automation of Electric Power Systems, vol. 35 No. 20, Oct. 25, 2011, pp. 13-19, with English abstract (pp. 13, 19).

Huang Nantian, "Multi-agent Joint Investment in Microgrid Source-storage Multi-strategy Bounded Rational Decision Evolution Game Capacity Planning," Proceedings of the CSEE, vol. 40 No. 4, Feb. 20, 2020, 16 pages, with English abstract (pp. 1,2,16).

Ma, Tengfei, "Research on Comprehensive Demand Response of Multiple Energy Complementary-Micro Energy Grid," Doctoral Dissertation for Beijing Jaotong University, Jun. 2019, 136 pages, with English abstract (pp. 1,2135,136).

* cited by examiner

OPTIMIZED REGULATING AND CONTROLLING METHOD AND SYSTEM FOR INTEGRATED ELECTRICITY AND HEAT SYSTEM WITH HEAT PUMPS

CROSS REFERENCE TO RELATED APPLICATIONS

This application is a Bypass Continuation-in-Part of co-pending Application No. PCT/CN2021/080499, filed on Mar. 12, 2021, for which priority is claimed under 35 U.S.C. § 120; and this application claims priority of Application No. 202010922508.2 filed in China on Sep. 4, 2020 under 35 U.S.C. § 119; the entire contents of all of which are hereby incorporated by reference.

FIELD

The present application relates to the technical field of energy operation, in particular to an optimized regulating and controlling method and system for an integrated electricity and heat system with heat pumps.

BACKGROUND

In the international environment where the energy structure is undergoing profound changes, global energy transition is advancing in depth, and the development and usage of clean energies such as wind power, photovoltaics and the like have also been vigorously supported, which is the key to sustainable development. Under the global trend of energy transition, a integrated electricity and heat system that combines a traditional thermal power plant including integrated electricity and heat units with wind power generation and photovoltaic power generation is an effective form of energy development and usage. However, during the heating period, the integrated electricity and heat units in the thermal power plant have a large output, and the operating mode of integrated electricity and heat of "determining generating capacity based on heat load" greatly reduces the adjusting capability of the integrated electricity and heat units and limits the flexibility of the power system, so that the phenomenon of wind and solar curtailment is serious.

At present, the method of optimizing the system structure and performance by adding heat storage tanks and electro-thermal conversion devices (such as heat pumps) to the integrated electricity and heat system is mainly used to decouple the constraints of determining generating capacity based on heat load. On this basis, the heat and power schedule optimization can be used to further promote the consumption of wind power and photovoltaics. Realizing the coordinated operation of power generation and heat supply units, rationally scheduling the heat and electric energies and optimizing the outputs of the integrated electricity and heat unit, the wind turbine unit and photovoltaics are of great significance for meeting the diversified energy usage demands in the system, improving the energy usage efficiency, realizing the transformation of operating mode of the traditional thermal power plant and reducing environmental pollution during energy usage.

According to the existing integrated electricity and heat system scheduling optimization methods, the units in the system are combined into a whole, and a integrated electricity and heat scheduling model is established with the objectives of optimal overall economic benefit and minimum overall operating cost of the system. However, these methods do not take into account that the units may belong to different agents, and the decision behaviors of different agents interact with each other, that is, there may be conflicts between the overall optimization of the system and the self-payoff optimization pursued by each agent. Therefore, the scheduling optimization scheme of these methods may not be the optimal solution for each agent, which will cause each agent to deviate from the optimization scheme and seek other schemes to obtain higher returns.

As an advanced optimization method, game theory is mainly about the study of the complex behaviors of multiple independent interacting agents, and is suitable for solving multi-agent multi-objective optimization problems.

Therefore, it is necessary to develop an optimized regulating and controlling method and system for an integrated electricity and heat system with heat pumps to cope with the defects in the prior art, so as to solve or alleviate one or more of the above-mentioned problems.

SUMMARY

In view of this, the present application provides an optimized regulating and controlling method and system for an integrated electricity and heat system with heat pumps. According to the present application, regulating and controlling can be performed by regarding units as different agents and taking maximization of the self-interest of each agent as the objective, so that the load demands of heat and power consumers can be met, and each unit agent can also be satisfied with its payoff to the greatest extent.

In one aspect, the present application provides an optimized regulating and controlling method for an integrated electricity and heat system with heat pumps. The method includes the following steps:

S1. establishing a composition and structure framework of the integrated electricity and heat system with heat pumps, and establishing an output model of each unit;

S2. establishing a payoff function model of each unit in the integrated electricity and heat system with heat pumps;

S3. establishing a non-cooperative game model of the integrated electricity and heat system with heat pumps; and S4. solving the game model by using a particle swarm optimization algorithm to obtain a heat and power scheduling optimization scheme of each unit.

In a further implementation according to the above aspect and any possible implementation, the process of solving the game model by using the particle swarm optimization algorithm includes:

S41. inputting relevant parameters;
S42. initializing an initial value of a particle swarm;
S43. calculating a corresponding payoff function;
S44. updating the particle swarm according to the payoff;
S45. calculating a fitness function; and
S46. confirming whether the obtained result is a Nash equilibrium solution; and if yes, completing the solving, otherwise, returning to S44.

In a further implementation according to the above aspect and any possible implementation, the establishment of the game model in S3 takes supply and demand balance of power and heat and unit operating conditions as the constraints and maximization of interests of each agent in the integrated electricity and heat system with heat pumps as the optimization objective.

In a further implementation according to the above aspect and any possible implementation, the integrated electricity and heat system with heat pumps includes a wind turbine unit, a photovoltaic unit, a power storage system, a heat and power unit and an heat pump.

In a further implementation according to the above aspect and any possible implementation, the output model of the wind turbine unit is:

$$P_{w,t} = \begin{cases} 0 & v_t < v_i, v_t > v_o \\ \dfrac{P_{wz}(v_t - v_i)}{v_r - v_i} & v_i \leq v_t \leq v_r \\ P_{wz} & v_r \leq v_t \leq v_o \end{cases};$$

where $v_t$ is the real-time wind speed at time t, $v_i$ is the cut-in wind speed of the wind turbine unit, $v_o$ is the cut-out wind speed of the wind turbine unit, $v_r$ is the rated wind speed of the wind turbine unit, and $P_{wz}$ is the installed capacity value of the wind turbine unit;

the payoff function model of the wind turbine unit is:

$$I_w = I_{wsell} + I_{wa} - I_{wm};$$

where $I_w$ is the payoff of the wind turbine unit, $I_{wsell}$ represents the revenue of sold electricity of the wind turbine unit, $I_{wa}$ represents the allowance revenue of the wind turbine unit, and $I_{wm}$ represents the maintenance cost of the wind turbine unit.

In a further implementation according to the above aspect and any possible implementation, the output model of the photovoltaic unit is:

$$P_{pv,t} = \alpha_{pv} P_{PVZ} \dfrac{A_t}{A_s}[1 + \alpha_T(T - T_{stp})];$$

where $\alpha_{pv}$ is the power derating factor of the photovoltaic unit, $P_{PVZ}$ is the installed capacity of the photovoltaic unit, $A_t$ is the actual irradiance of the photovoltaic unit at time t, $A_s$ is the irradiance under standard conditions. $\alpha_T$ is the power temperature coefficient, $T_{stp}$ is the temperature under standard conditions, and T is the real-time temperature:

the payoff function model of the photovoltaic unit is:

$$I_{pv} = I_{pvsell} + I_{pva} - I_{pvm};$$

where $I_{pv}$ is the payoff of the photovoltaic unit, $I_{pvsell}$ represents the revenue of sold electricity of the photovoltaic unit, $I_{pva}$ represents the allowance revenue of the photovoltaic unit, and $I_{pvm}$ represents the maintenance cost of the photovoltaic unit.

In a further implementation according to the above aspect and any possible implementation, the output model of the power storage system is:

$$C_{e,t+1} = \begin{cases} (1-\alpha)C_{e,t} - \beta_c P_{e,t}\Delta t & P_{e,t} \leq 0, \\ (1-\alpha)C_{e,t} - \dfrac{1}{\beta_d}P_{e,t}\Delta t & P_{e,t} > 0; \end{cases}$$

where $C_{e,t+1}$ is the remaining power of a storage battery at time t+1, $C_{e,t}$ is the remaining power of the storage battery at time t, a is the self-discharge efficiency of the storage battery, $\beta_c$ and $\beta_d$ are the charge efficiency and the discharge efficiency of the storage battery, respectively, $P_{e,t}$ is the charge/discharge power of the storage battery, and $\Delta t$ is the charge/discharge duration.

In a further implementation according to the above aspect and any possible implementation, the output model of the heat and power unit is:

$$P_{pc,t} = P_{chp,t} + \alpha_{chp} Q_{chp,t};$$

where $P_{pc,t}$ is the electric power of a pure condensing condition at time t, $P_{chp,t}$ is the electric power of the heat and power unit at time t, $Q_{chp,t}$ is the thermal power of the heat and power unit at time t, and $\alpha_{chp}$ is the electro-thermal conversion coefficient;

the payoff function model of the heat and power unit is:

$$I_{chp} = I_{ssell} - I_{sf} - I_{sm} - I_{sa};$$

where $I_{chp}$ is the payoff of the heat and power unit, $I_{ssell}$ is the revenue of sold electricity and heat of the heat and power unit, $I_{sf}$ is the fuel cost of the heat and power unit, $I_{sm}$ is the maintenance cost of the heat and power unit, and $I_{sa}$ represents the cost of wind and solar curtailment that the heat and power unit needs to afford.

In a further implementation according to the above aspect and any possible implementation, the output model of the heat pump is:

$$\chi = \dfrac{Q_U}{W}, Q_{pu} = \chi \cdot P_{pu};$$

where $\chi$ is the heat supply efficiency of the heat pump, $Q_U$ is the heat energy converted by the heat pump, W is the electric energy consumed by the heat pump, $Q_{pu}$ is the heating capacity of the heat pump, and $P_{pu}$ is the input power of the heat pump.

In another aspect, the present application provides an optimized regulating and controlling device for an integrated electricity and heat system with heat pumps. The device is used to implement any regulating and controlling method described above:

the device includes a control module and a communication module; the communication module is separately connected to each unit of the integrated electricity and heat system with heat pumps, and configured to acquire data of each unit and send regulating and controlling instructions to each unit; and the control module is configured to store an output model, a payoff function model, constraint conditions and a game model of each unit and solve the game model of each unit to obtain an optimal regulating and controlling scheme.

Compared with the prior art, the present application can obtain the following technical effects:

according to the present application, optimization is performed no longer by regarding all the units in the integrated electricity and heat system with heat pumps as a whole, instead by regarding the units as different agents and taking maximization of the self-interest of each agent as the objective. Therefore, a non-cooperative game model of heat and power scheduling is established by viewing the multi-agent decision optimization problem based on the idea of game theory and considering the interactions among the agents, which is conductive to coping with the diversity of the agents of the integrated electricity and heat system with heat pumps; and according to the present application, the particle swarm optimization algorithm is combined with an iterative algorithm to solve the game model. The particle swarm optimization algorithm simulates the process of each agent searching for the optimal solution under given conditions, and the iterative algorithm simulates the response of each agent to decision changes of other agents. The optimal scheme of output scheduling of each unit can be determined through the obtained Nash equilibrium solution. The output scheme can not only meet the load demands of heat and power consumers, but also satisfy all the agents.

Of course, any product implementing the present application does not necessarily need to achieve all the above technical effects at the same time.

BRIEF DESCRIPTION OF THE DRAWINGS

In order to more clearly illustrate the technical solution of the embodiments of the present application, the accompanying drawings used in the embodiments will be briefly described below. Obviously, the accompanying drawings in the following description are only some embodiments of the present application, and those of ordinary skill in the art can obtain other accompanying drawings according to these drawings without any creative work.

DETAILED DESCRIPTION OF THE EMBODIMENTS

In order to better understand the technical solution of the present application, the embodiments of the present application will be described in detail with reference to the accompanying drawings.

It should be clear that the described embodiments are only part of the embodiments of the present application, rather than all the embodiments. All other embodiments obtained by those of ordinary skill in the art based on the embodiments of the present application without creative work are within the protection scope of the present application.

The terms used in the embodiments of the present application are only for the purpose of describing specific embodiments, and are not intended to limit the present application. "a", "said" and "the" in the singular form used in the embodiments of the present application and the appended claims are also intended to include plural forms, unless the context clearly indicates otherwise.

Units in an integrated electricity and heat system with heat pumps may belong to different agents, and the decision behaviors of different agents interact with each other, that is, there may be conflicts between the overall optimization of the system and the self-payoff optimization pursued by each agent. Therefore, the heat and power scheduling problem of the integrated electricity and heat system with heat pumps is a multi-agent decision optimization problem. Based on the operating output characteristic and the payoff function of each unit in the integrated electricity and heat system with heat pumps, how to optimize the scheduling decision of each unit and obtain the corresponding output scheme is the technical problem to be solved by the present application.

In order to solve the problem, for an integrated electricity and heat system with heat pumps involving multiple agents such as a integrated electricity and heat unit, a wind turbine unit, a photovoltaic unit and the like, the present application based on established output models and payoff function models of units, a non-cooperative game model of heat and power scheduling is established by fully considering the behaviors of each agent and the corresponding interests and also considering the interactions among the behaviors, based on the idea of the game theory, and by taking the supply and demand balance of power and heat and unit operating conditions as the constraints and maximization of interests of each agent in the integrated electricity and heat system with heat pumps as the optimization objective, the particle swarm optimization algorithm is combined with the iterative algorithm to solve the equilibrium strategy of the game, and the finally obtained Nash equilibrium strategy is the optimized output scheme of each unit, thereby providing guidance for the heat and power scheduling decision.

Figure 1:
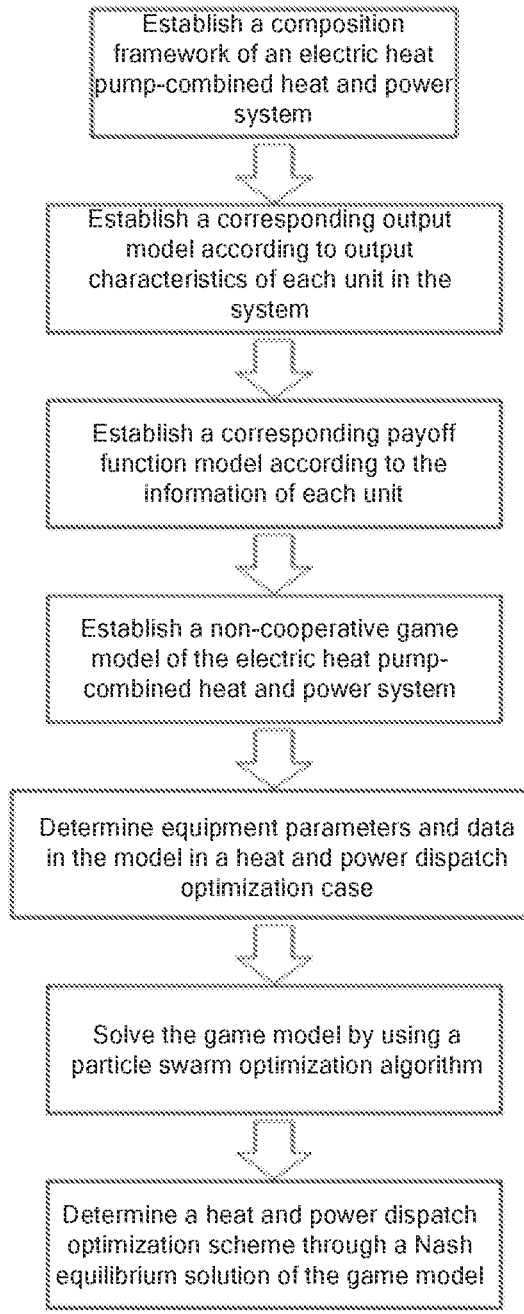
FIG. 1 is a flow chart of an optimized regulating and controlling method for an integrated electricity and heat system with heat pumps according to an embodiment of the present application.

An optimized regulating and controlling method for an integrated electricity and heat system with heat pumps, as shown in FIG. 1, includes the following steps:

Step 1. A composition and structure framework of the integrated electricity and heat system with heat pumps is established, and a heat/power output model of each unit is established.

Figure 2:
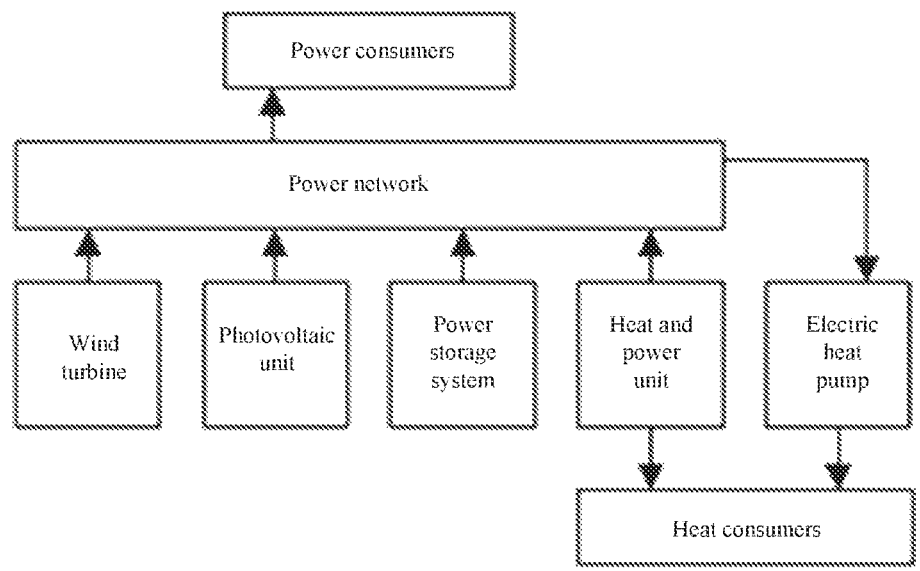
FIG. 2 is a block diagram of an integrated electricity and heat system with heat pumps according to an embodiment of the present application.

1-1) The integrated electricity and heat system with heat pumps includes two parts: a power supply part and a heat supply part, as shown in FIG. 2. The power supply part is composed of a wind turbine unit, a photovoltaic unit, a power storage system and power consumers, and the heat supply part is composed of a integrated electricity and heat unit, an heat pump and heat consumers.

1-2) Output Model of Wind Turbine Unit

In the integrated electricity and heat system with heat pumps, the output of the wind turbine unit is constrained by the installed capacity and actual conditions. When the installed capacity is determined, the maximum wind power output at each time is determined by the actual conditions such as weather, environment and the like, and the wind turbine unit output and the wind speed meet the following nonlinear relationship:

$$P_{w,t} = \begin{cases} 0 & v_t < v_i \text{ or } v_t > v_o \\ \dfrac{P_{wz}(v_t - v_i)}{v_r - v_i} & v_i \leq v_t \leq v_r \\ P_{wz} & v_r \leq v_t \leq v_o \end{cases} \quad (1)$$

where $v_t$ is the real-time wind speed at time t, $v_i$ is the cut-in wind speed of the wind turbine unit, $v_o$ is the cut-out wind speed of the wind turbine unit, $v_r$ is the rated wind speed of the wind turbine unit, and $P_{wz}$ is the installed capacity value of the wind turbine unit. When the real-time wind speed is less than the cut-in wind speed or greater than the cut-out wind speed, the wind turbine unit is in a shutdown state. When the real-time wind speed is greater than the cut-in wind speed and less than the rated wind speed, the real-time power and the wind speed meet the linear function relationship. When the real-time wind speed is greater than the rated wind speed and less than the cut-out wind speed, the real-time output value is equal to the installed capacity value.

1-3) Output Model of Photovoltaic Unit

Similarly, the output of the photovoltaic unit is also constrained by the installed capacity and actual conditions. When the installed capacity is determined, the output of the photovoltaic unit is related to the light intensity and temperature, and the output of the photovoltaic unit can be expressed by the following formula:

$$P_{pv,t} = \alpha_{pv} P_{PVZ} \frac{A_t}{A_s} [1 + \alpha_T (T - T_{stp})] \quad (2)$$

where $\alpha_{pv}$ is the power derating factor of the photovoltaic unit, $P_{PVZ}$ is the installed capacity of the photovoltaic unit, $A_t$ is the actual irradiance of the photovoltaic unit at time t. $A_s$ is the irradiance under standard conditions, $\alpha_T$ is the power temperature coefficient, and $T_{stp}$ is the temperature under standard conditions. Since the value of $\alpha_T$ is relatively very small, the impact of temperature changes on the output of the photovoltaic unit is approximately 0, so the output of the photovoltaic unit can be approximately directly proportional to the actual irradiance Ae, that is:

$$P_{pv,t} = \alpha_{pv} P_{PVZ} \frac{A_t}{A_s}. \quad (3)$$

1-4) Output Model of Power Storage System

The SOC of a battery is the ratio of the remaining power to the full capacity of a battery.

$$SOC = \frac{C_{e,t}}{C_{full}} \quad (4)$$

where $C_{e,t}$ is the remaining power of the storage battery at time t, and $C_{full}$ is the capacity of the storage battery.

$P_{e,t}$ is defined as the charge/discharge power of the storage battery. When $P_{e,t} \leq 0$, it means the battery is being charged. When $P_{e,t} > 0$, it means the battery is being discharged. The energy storage state of the storage battery can be expressed as follows:

$$C_{e,t+1} = \begin{cases} (1-\alpha)C_{e,t} - \beta_c P_{e,t}\Delta t & P_{e,t} \leq 0 \\ (1-\alpha)C_{e,t} - \dfrac{1}{\beta_d} P_{e,t}\Delta t & P_{e,t} > 0 \end{cases}, \quad (5)$$

where $\alpha$ is the self-discharge efficiency of the storage battery, and $\beta_c$ and $\beta_d$ are the charge efficiency and the discharge efficiency of the storage battery, respectively.

1-5) Output Model of Integrated Electricity and Heat Unit

Figure 3:
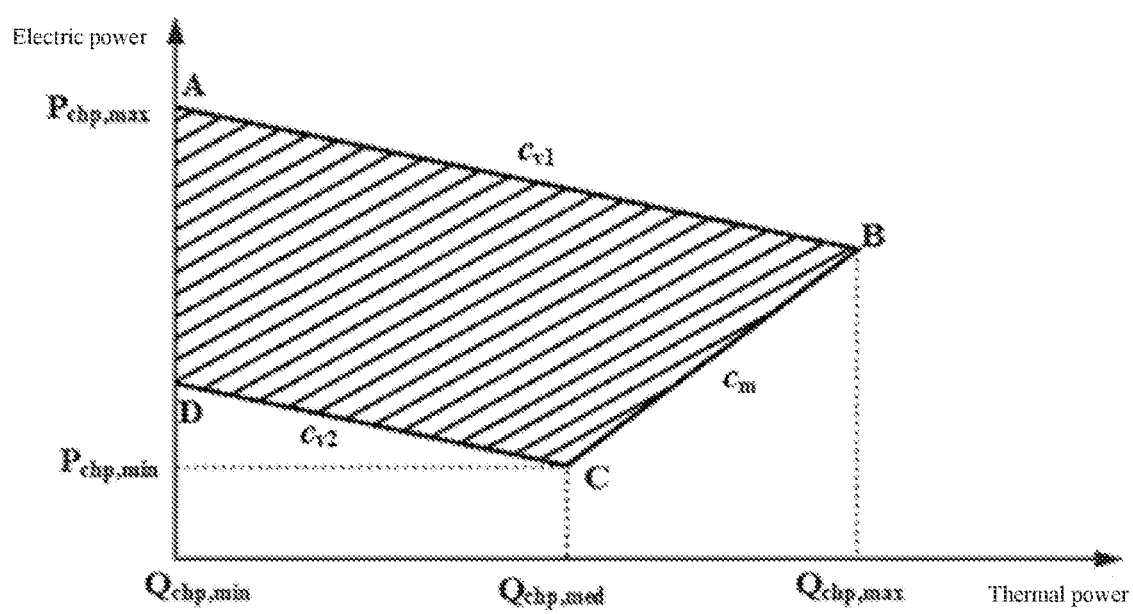
FIG. 3 is a characteristic curve diagram of a integrated electricity and heat unit according to an embodiment of the present application.

In the extraction condensing unit selected by the present application, the entire steam turbine is composed of three parts: a low pressure cylinder, an intermediate pressure cylinder and a high pressure cylinder. High-temperature high-pressure steam generated in a boiler enters the steam turbine to do work, heat supply with steam extraction comes from exhaust steam of the intermediate pressure cylinder, the rest steam of the intermediate pressure cylinder enters the low pressure cylinder to do work and then enters a steam condenser to be condensed, and the condensed steam returns to the boiler to realize reuse. Based on this working principle, $(P_{chp} + \alpha_{chp} Q_{chp})$ can be equivalent to the power of the integrated electricity and heat unit:

$$P_{pc,t} = P_{chp,t} + \alpha_{chp} Q_{chp,t} \quad (6)$$

where $P_{pc,t}$ is the electric power of a pure condensing condition at time t, $P_{chp,t}$ is the electric power of the unit at time t, $Q_{chp,t}$ is the thermal power of the unit at time t, and $\alpha_{chp}$ is the electro-thermal conversion coefficient, representing that 1 W of thermal power can be converted into the electric power of $\alpha_{chp}$W. The ranges of the electric power $P_{chp,t}$ and the thermal power $Q_{chp,t}$ are shown in FIG. 3. The adjustable area of the power of the integrated electricity and heat unit is the quadrilateral area formed by ABCD. It is apparent that when the thermal power increases, the adjustable electric power range decreases rapidly, and the peak load regulating and controlling capacity of the unit is also poorer.

1-6) Output Model of Heat Pump

Figure 4:
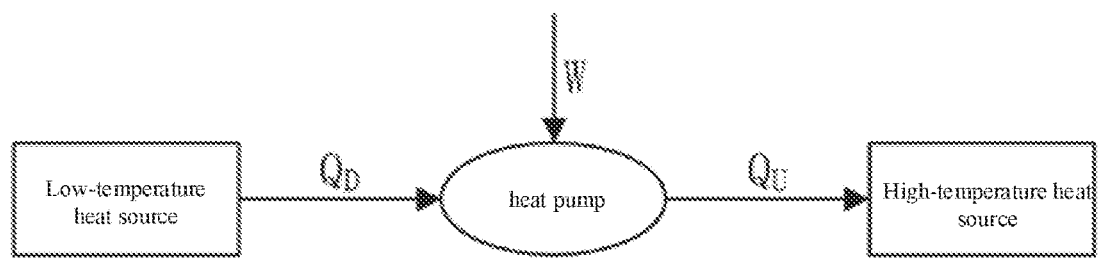
FIG. 4 is a diagram showing an energy conversion relationship of an heat pump according to an embodiment of the present application.

The heat pump can extract low-temperature waste heat from heat supply return water of a thermal power plant as low-quality heat energy and convert it into high-quality heat energy. FIG. 4 describes the basic energy conversion of the heat pump. Under ideal conditions, according to the first law of thermodynamics, the following relationship can be obtained:

$$Q_U = Q_D + W \quad (7)$$

where $Q_U$ is the high-quality heat energy converted by the heat pump. $Q_D$ is the low-quality heat energy absorbed from a low-temperature heat source, and W is the electric energy consumed by the heat pump. The heat supply efficiency (energy efficiency coefficient) $\chi$ of the heat pump is expressed as follows:

$$\chi = \frac{Q_U}{W} \quad (8)$$

From the above formula, the thermoelectric conversion relationship of the heat pump can be expressed as: $Q_{pu}=\chi \cdot P_{pu}$, where $Q_{pu}$ is the heating capacity of the heat pump, and $P_{pu}$ is the input power of the heat pump.

Step 2. A model of the payoff function and constraint conditions of each unit in the integrated electricity and heat system with heat pumps is established.

2-1) Payoff Function of Wind Turbine Unit

The payoff $I_w$ of the wind turbine unit can be expressed as:

$$I_w = I_{wsell} + I_{wa} - I_{wm} \tag{9}$$

$$I_{wsell} = \Sigma_{t=1}^{T} C_{sell,t} P_{ws,t} \tag{10}$$

$$I_{wa} = \Sigma_{t=1}^{T} C_{wsu} P_{ws,t} \tag{11}$$

$$I_{wm} = \Sigma_{t=1}^{T} K_{wm} P_{wc,t} \tag{12}$$

where $I_{wsell}$ represents the revenue of sold electricity of the wind turbine unit, $I_{wa}$ represents the allowance revenue of the wind turbine unit, $I_{wm}$ represents the maintenance cost of the wind turbine unit, $C_{sell,t}$ represents the real-time electricity price at time t, $C_{wsu}$ represents the subsidized electricity price of the wind turbine unit, $P_{ws,t}$ represents the power of sold electricity of the wind turbine unit at time t, $K_{wm}$ represents the maintenance factor of the wind turbine unit, and $P_{wc,t}$ represents the available electricity supply power of the wind turbine unit at time t.

2-2) Payoff Function of Photovoltaic Unit

The payoff function $I_{pv}$ of the photovoltaic battery is similar to that of the wind turbine unit:

$$I_{pv} = I_{pvsell} + I_{pva} - I_{pvm} \tag{13}$$

$$I_{pvsell} = \Sigma_{t=1}^{T} C_{sell,t} P_{pvs,t} \tag{14}$$

$$I_{pva} = \Sigma_{t=1}^{T} C_{pvsu} P_{pvs,t} \tag{15}$$

$$I_{pvm} = \Sigma_{t=1}^{T} K_{pvm} P_{pvc,t} \tag{16}$$

where $I_{pvsell}$ represents the revenue of sold electricity of the photovoltaic unit. $I_{pva}$ represents the allowance revenue of the photovoltaic unit, $I_{pvm}$ represents the maintenance cost of the photovoltaic unit, $C_{pvsu}$ represents the subsidized electricity price of the photovoltaic unit. $P_{pvs,t}$ represents the power of sold electricity of the photovoltaic unit at time t, $K_{pvm}$ represents the maintenance factor of the photovoltaic unit, and $P_{pvc,t}$ represents the available electricity supply power of the photovoltaic unit at time t.

2-3) The integrated electricity and heat unit and the heat pump are regarded as a thermoelectric subsystem. In the system, the integrated electricity and heat unit is the main component, and also the core of power supply and heat supply, and the heat pump plays an auxiliary role in electrothermal conversion, and can solve the mismatch between the demand of the heat consumers and the heat supply of the integrated electricity and heat unit to some extent, thereby improving the adjusting capability of the entire system. The payoff $I_{chp}$ of the system may be expressed as follows:

$$I_{chp} = I_{ssell} - I_{sf} - I_{sm} - I_{sa} \tag{17}$$

$$I_{ssell} = \Sigma_{t=1}^{T} [C_{sell,t} P_{chps,t} + C_{sell-Q,t} Q_{load,t}] \tag{18}$$

$$I_{sf} = \Sigma_{t=1}^{T} (C_p P_{chp,t} + C_q Q_{chp,t}) = \Sigma_{t=1}^{T} \left( \frac{0.123 c_f P_{chp,t}}{\eta_p} + \frac{0.1288 c_f Q_{chp,t}}{\eta_q} \right) \tag{19}$$

$$I_{sm} = \Sigma_{t=1}^{T} [K_{sm1} P_{chps,t} + K_{sm2} Q_{load,t}] \tag{20}$$

$$I_{sa} = \Sigma_{t=1}^{T} \mu_w C_{sell,t} (P_{wc,t} - P_{ws,t}) + \Sigma_{t=1}^{T} \mu_{pv} C_{sell,t} (P_{pvc,t} - P_{pvs,t}) \tag{21}$$

where $I_{ssell}$ is the revenue of sold electricity and heat of the thermoelectric subsystem, $I_{sf}$ is the fuel cost of the thermoelectric subsystem, $I_{sm}$ is the maintenance cost of the thermoelectric subsystem, $I_{sa}$ represents the cost of wind and solar curtailment that the thermoelectric subsystem needs to afford, $C_{sell-Q,t}$ represents the unit price of heat energy at time t, $P_{chps,t}$ is the electricity sold of the integrated electricity and heat unit at time t, $Q_{load,t}$ is the heat load demand in the integrated electricity and heat system with heat pumps at time t. $C_p$ and $C_q$ are the average cost of electricity generation and the average cost of heat generation of the integrated electricity and heat unit, respectively, and $c_f$ is the unit cost of coal, where 0.123 and 0.1288 are the electricity equivalent and heat equivalent of standard coal in kg/kWh, respectively, $\eta_p$ and $\eta_q$ are the electricity generation efficiency and the heat generation efficiency of the integrated electricity and heat unit, respectively, $K_{sm1}$ and $K_{sm2}$ are the maintenance factor of the electricity output and the maintenance factor of the heat output of the thermoelectric subsystem, respectively, pw represents the penalty factor for wind curtailment, and $\mu_{pv}$ is the penalty factor for solar curtailment. Part $P_{chps,t}$ of the electricity generating capacity $P_{chp,t}$ of the integrated electricity and heat unit is used to meet the load demand of the power consumers, and the other part $P_{pu,t}$ is used as the input power of the heat pump, which is formula (22).

$$P_{chp,t} = P_{chps,t} + P_{pu,t} \tag{22}$$

2-4) Constraint Conditions 2-4-1) Constraint of Power Supply Balance

The power must be balanced in the power transmission process of the entire network. This balance characteristic has a decisive influence on the frequency stability and voltage stability of the network. If the electricity generating power is greater than the required load, the power network frequency will increase accordingly. Otherwise, the power network frequency will decrease accordingly. The stability of the electric power system should depend on the stability of the network frequency.

$$P_{chps,t} + P_{ws,t} + P_{pvs,t} + P_{e,t} = P_{load,t} \tag{23}$$

where $P_{load,t}$ is the electrical load demand in the integrated electricity and heat system with heat pumps at time t, and $P_{e,t}$ is the charge/discharge power of the electric energy storage.

2-4-2) Constraint of Heat Supply Balance

In the heat supply system, the balance between the demand of the consumers and the supply of the heat source must be kept. The heat supply temperature increases as the demand of the heat consumers decreases, and vice versa. The quality of heat supply depends to some extent on the heat supply temperature, so it is necessary to ensure that the result of scheduling is consistent with the heat supply demand. Regardless of the heat loss caused by transmission, the constraint of heat supply balance is as follows:

$$Q_{chp,t} + Q_{pu,t} = Q_{load,t} \tag{24}$$

where $Q_{chp,t}$ is the heat supply power of the integrated electricity and heat unit at time t, and $Q_{pu,t}$ is the heating power of the heat pump within time t.

2-4-3) Constraint of Unit Output

In the optimized scheduling of the integrated electricity and heat system with heat pumps, the actual electricity supply power $P_{ws,t}$ of the wind turbine unit at each time should be less than or equal to the available electricity supply power $P_{wc,t}$, and the actual electricity supply power $P_{pvs,t}$ of the photovoltaic unit at each time should be less than or equal to the available electricity supply power $P_{pvc,t}$. The constraints of power storage equipment during working include a capacity constraint and a charge/discharge output constraint. The heat pump provides part of heat load in the operating process, and must output within the constraint range.

$$0 \leq P_{ws,t} \leq P_{wc,t} \quad (25)$$

$$0 \leq P_{pvs,t} \leq P_{pvc,t} \quad (26)$$

$$SOC_{min} \leq SOC \leq SOC_{max} \quad (27)$$

$$|P_{e,t}| \leq |P_{e,t,max}| \quad (28)$$

$$P_{chp,min} \leq P_{chp,t} \leq P_{chp,max} \quad (29)$$

$$Q_{chp,min} \leq Q_{chp,t} \leq Q_{chp,max} \quad (30)$$

$$P_{pu,min} \leq P_{pu,t} \leq P_{pu,max} \quad (31)$$

where $|P_{e,t,max}|$ is the maximum charge/discharge power of the power storage equipment, $P_{chp,max}$ and $P_{chp,min}$ are the upper limit and the lower limit of the electricity supply power of the integrated electricity and heat unit, respectively, $Q_{chp,max}$ and $Q_{chp,min}$ are the upper limit and the lower limit of the heat supply power of the integrated electricity and heat unit, respectively, and $P_{pu,max}$ and $P_{pu,min}$ are the upper limit and the lower limit of the input power of the heat pump. The electric power $P_{chp,t}$ and the thermal power $Q_{chp,t}$ of the integrated electricity and heat unit should also be within the quadrilateral ABCD shown in FIG. 3.

Step 3. A non-cooperative game model of the integrated electricity and heat system with heat pumps is established. That is, a corresponding non-cooperative game model is established for each unit agent according to the operating mode of the integrated electricity and heat system with heat pumps.

3-1) Game Theory and Integrated Electricity and Heat System with Heat Pumps

Game theory is a mathematical study theory that studies how to make the optimum decision among conflicts and opposition. The essence of game theory is rational thinking based on system thinking, with which one should use the interests of others wisely to choose the most suitable choice for oneself A rational choice refers to a choice that maximizes the objective function under the cognition of the game participants, that is, all people participating in decision-making are rational and will adopt the optimal strategy to get the maximum payoffs for themselves at the minimum cost.

The essential elements of game theory are: players—participants of game behaviors and the main part of the decision, that is, persons who make the decision in the game, where there are at least two players; strategy set—the set of all optional schemes of each player during the game; and payoffs—the determined utility or expected utility of each player, where the value of payoffs depends not only on the strategies of the participant individual agent, but also on the strategies of other participants besides itself.

Nash equilibrium is an important concept in the game theory system. It represents a combination of strategies, which is the set of optimal strategies of all players. When rational players adopt Nash equilibrium as their strategies, no player will change his strategy alone, otherwise his payoffs will decrease. For any player i, $u_i$, $s_i$ and $S_i$ are marked as his payoffs, strategies and strategy set, respectively. If $(s_1^*, \ldots, s_n^*)$ is a Nash equilibrium of the game, then for any $s_i \in S_i$, the following formula is satisfied:

$$u_i(s_1, \ldots s_{i-1}^*, s_i^*, s_{i+1}^*, \ldots, s_n^*) \geq u_i(s_1, \ldots s_{i-1}^*, s_i^*, s_{i+1}^*, \ldots s_n^*) \quad (32)$$

Regarding each unit agent in the integrated electricity and heat system with heat pumps as a player, the output of each unit is the strategy of the corresponding player. In the actual operating mode, the units usually belong to different operators, that is, the game is a non-cooperative game. In this game, since there is no binding agreement between the players, each player seeks to implement the strategy that maximizes the self-interest.

3-2) Non-Cooperative Game Model of Integrated Electricity and Heat System with Heat Pumps The non-cooperative game model of the integrated electricity and heat system with heat pumps is as follows:

(1) Participants: the wind turbine unit, the photovoltaic unit and the thermoelectric subsystem (including the integrated electricity and heat unit and the heat pump)

(2) Strategy set: the available electricity supply power $P_{wc,t}$ of the wind turbine unit, the available electricity supply power $P_{pvc,t}$ of the photovoltaic unit, and the electricity supply power $P_{chp,t}$ and the heat supply power $Q_{chp,t}$ of the integrated electricity and heat unit.

(3) Payoff function: payoff $I_k$ of each unit, $k \in \{w, pv, chp\}$.

When each unit adopts a non-cooperative game mode, there is mutual disturbance between the electricity supply power of each unit, and the participant of the game will change his own decision behaviors according to the decisions of other participants. Each participant will choose the decision that maximizes his own payoffs based on the decisions of other participants, that is:

$$P_{wc} = \underset{P_{wc}}{\arg\max} I_w(P_{wc}, P_{pvc}, P_{chp}, Q_{chp}) \quad (33)$$

$$P_{pvc} = \underset{P_{pvc}}{\arg\max} I_{pv}(P_{wc}, P_{pvc}, P_{chp}, Q_{chp}) \quad (34)$$

$$(P_{chp}, Q_{chp}) = \underset{P_{chp}, Q_{chp}}{\arg\max} I_{chp}(P_{wc}, P_{pvc}, P_{chp}, Q_{chp}) \quad (35)$$

where $$\underset{P_{wc}}{\arg\max} I_w(P_{wc,i}, P_{pvc,i}, P_{chp,i}, Q_{chp,i})$$

represents $P_{wc}$ when $P_{wc}$ is a variable and $I_w$ gets the maximum value; and $$\underset{P_{pvc}}{\arg\max} I_{pv}(P_{wc,i}, P_{pvc,i}, P_{chp,i}, Q_{chp,i})$$

and $$\underset{P_{chp}, Q_{chp}}{\arg\max} I_{chp}(P_{wc,i}, P_{pvc,i}, P_{chp,i}, Q_{chp,i})$$

are similar.

The Nash equilibrium solution $(P_{ws}^*, P_{pvs}^*, P_{chp}^*, Q_{chp}^*)$ of the non-cooperative game model can be obtained by obtaining the solutions of formulae (33-35). At this time, the payoffs of the units can be expressed as $I_w(P_{ws}*,P_{pvs}*,P_{chp}*,Q_{chp}*)$, $I_{pv}(P_{ws}*,P_{pvs}*,P_{chp}*,Q_{chp}*)$ and $I_{chp}(P_{ws}*,P_{pvs}*,P_{chp}*,Q_{chp}*)$.

Step 4. The established game model is solved by using a particle swarm optimization algorithm and an iterative algorithm to obtain a heat and power scheduling optimization scheme of each unit.

The particle swarm optimization algorithm is an algorithm used to simulate the foraging behaviors of birds and beasts. It combines one's own flying or traveling experience with other birds or beasts' flying or traveling experience to search for the optimal solution. The algorithm solves the space search path by changing two main parameters, namely the flight direction and speed. The algorithm is simple in principle and easy to implement, and thus, is widely used in scheduling optimization of a system.

Figure 5:
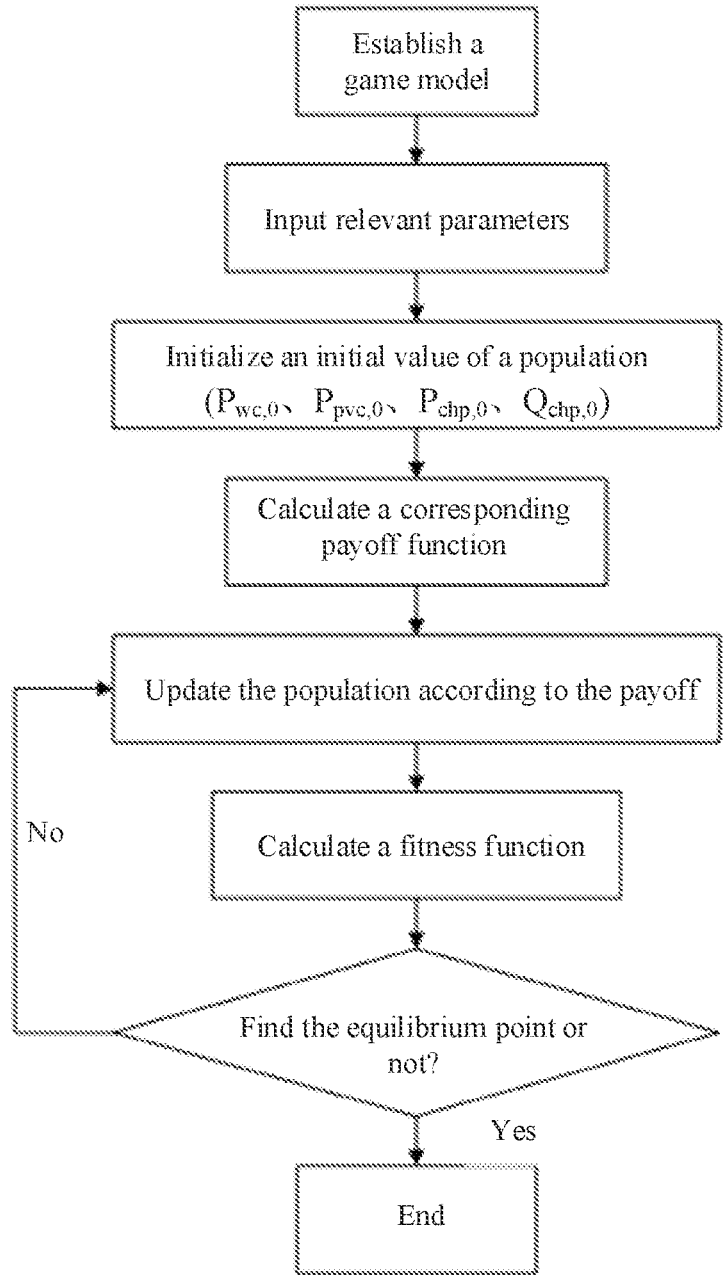
FIG. 5 is a flow chart of solving a game model by a particle swarm optimization algorithm according to an embodiment of the present application.

In the process of solving a non-cooperative game model, the combination of strategies of each unit is regarded as a particle, and one particle includes two attributes, namely velocity and position. The formulae of the particle swarm update algorithm are as follows:

$$v_{i,z}^{t+1} = \omega v_{i,z}^t + c_1 r_1(p_{i,z} - x_{i,z}^t) + c_2 r_2(p_{q,z} - x_{i,z}^t) \quad (36)$$

$$x_{i,z}^{t+1} = x_{i,z}^t + v_{i,z}^{t+1} \quad (37)$$

where $\omega$ represents the inertia coefficient; t represents the number of iterations; $v_{i,z}^t$ represents the z-th dimension velocity of the t-th iteration of the i-th particle; $c_1$ and $c_2$ represent the acceleration constants; $r_1$ and $r_2$ represent random numbers in (0,1); $p_{i,z}$ represents the individual optimal value of the z-th dimension of the i-th particle; $p_{q,z}$ represents the global optimal value of the z-th dimension of all particles; and $x_{i,z}^t$ represents the z-th dimension position of the t-th iteration of the i-th particle. The initial value of the particle swarm optimization algorithm is a random particle swarm, which can be determined by estimating the particles. In the iterative process, the particle tracks the global and individual optimal values to update its own velocity and position. The fitness function is used to evaluate the particle's position, the new position is used in combination to update the historical optimal position, and finally the optimal solution is obtained when the iteration termination criterion is met. The process of solving the game model is shown in FIG. 5.

The specific steps of iteratively solving the non-cooperative game model by using the particle swarm optimization algorithm are as follows:

(1) Equipment operating parameters and limit parameters are initialized, and constraints of the upper and lower limits of the parameters are set.

(2) The initial value $(P_{wc,0}, P_{pvc,0}, P_{chp,0}, Q_{chp,0})$ of the equilibrium point is set.

(3) Game participants independently perform optimization according to a certain order.

(4) The optimization result of the i-th round is $(P_{wc,i}, P_{pvc,i}, P_{chp,i}, Q_{chp,i})$, then the optimization result obtained after the (i+1)-th round of iterative optimization is $(P_{wc,i+1}, P_{pvc,i+1}, P_{chp,i+1}, Q_{chp,i+1})$, and the following relationships are met:

$$P_{wc,i+1} = \arg\max_{P_{wc}} I_w(P_{wc,i}, P_{pvc,i}, P_{chp,i}, Q_{chp,i}) \quad (38)$$

$$P_{pvc,i+1} = \arg\max_{P_{pvc}} I_{pv}(P_{wc,i}, P_{pvc,i}, P_{chp,i}, Q_{chp,i}) \quad (39)$$

$$(P_{chp,i+1}, Q_{chp,i+1}) = \arg\max_{P_{chp},Q_{chp}} I_{chp}(P_{wc,i}, P_{pvc,i}, P_{chp,i}, Q_{chp,i}) \quad (40)$$

where $P_{wc,i}$, $P_{pvc,i}$, $P_{chp,i}$ and $Q_{chp,i}$ represent the available electricity supply power of the wind turbine unit, the available electricity supply power of the photovoltaic unit and the available electricity supply power and the available heat supply power of the thermoelectric subsystem after the i-th round of optimization, respectively.

(5) It is confirmed whether the obtained solution is a Nash equilibrium solution. If the participant does not change his strategy during the whole round of the game, the whole process terminates.

$$(P_{wc,i+1}, P_{pvc,i+1}, P_{chp,i+1}, Q_{chp,i+1}) = (P_{wc,i}, P_{pvc,i}, P_{chp,i}, Q_{chp,i}) = (P_{ws}*, P_{pvs}*, P_{chp}*, Q_{chp}*)$$

where $P_{ws}*$, $P_{pvs}*$, $P_{chp}*$ and $Q_{chp}*$ are the available electricity supply power of the wind turbine unit, the available electricity supply power of the photovoltaic unit and the available electricity supply power and the available heat supply power of the thermoelectric subsystem corresponding to the Nash equilibrium solution, respectively. According to the electrical and heat load demands and the situations of other units, each unit determines its own electricity and heat generating capacities, that is, available electricity/heat supply power, as the decision values to be optimized. The electricity/heat supply power is the amount consumed, which is the actual trading volume of electricity/heat. In the iterative process, when the decision no longer changes (equal, or with slight amplitude of variation, such as less than 1%), it is considered that the Nash equilibrium has been achieved. The Nash equilibrium of this problem is an inevitable existence, so the equilibrium will be achieved definitely.

(6) After the output of each unit is determined according to the Nash equilibrium solution, the optimized scheduling scheme of the integrated electricity and heat system with heat pumps can be obtained.

Embodiment 1

Figure 6:
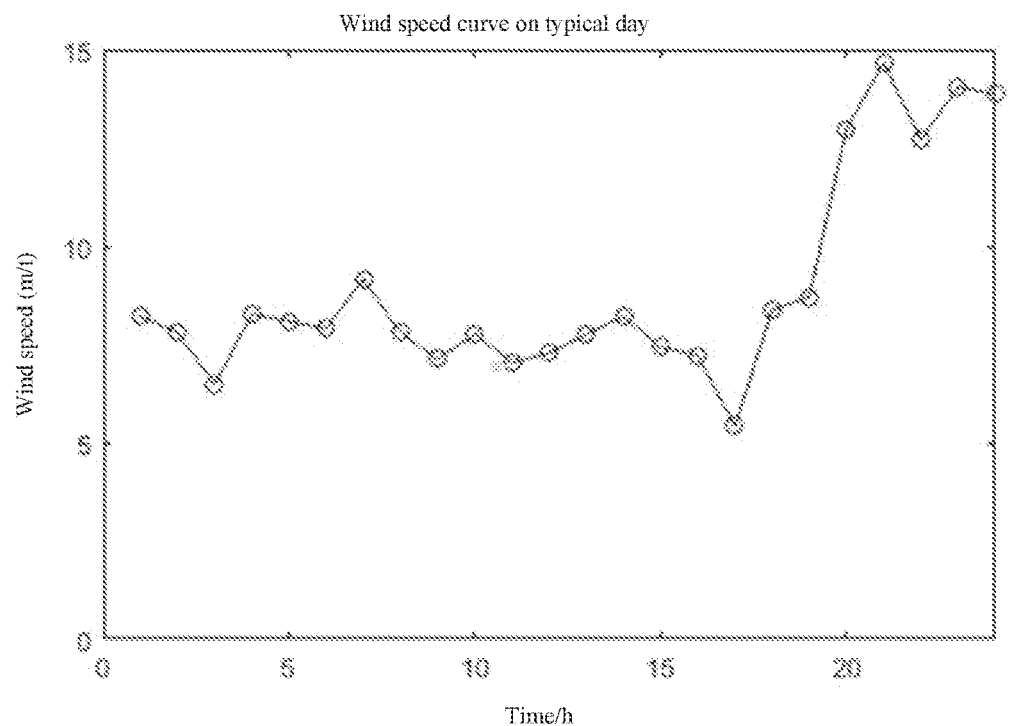
FIG. 6 is a wind speed curve on a typical day according to an embodiment of the present application.
Figure 7:
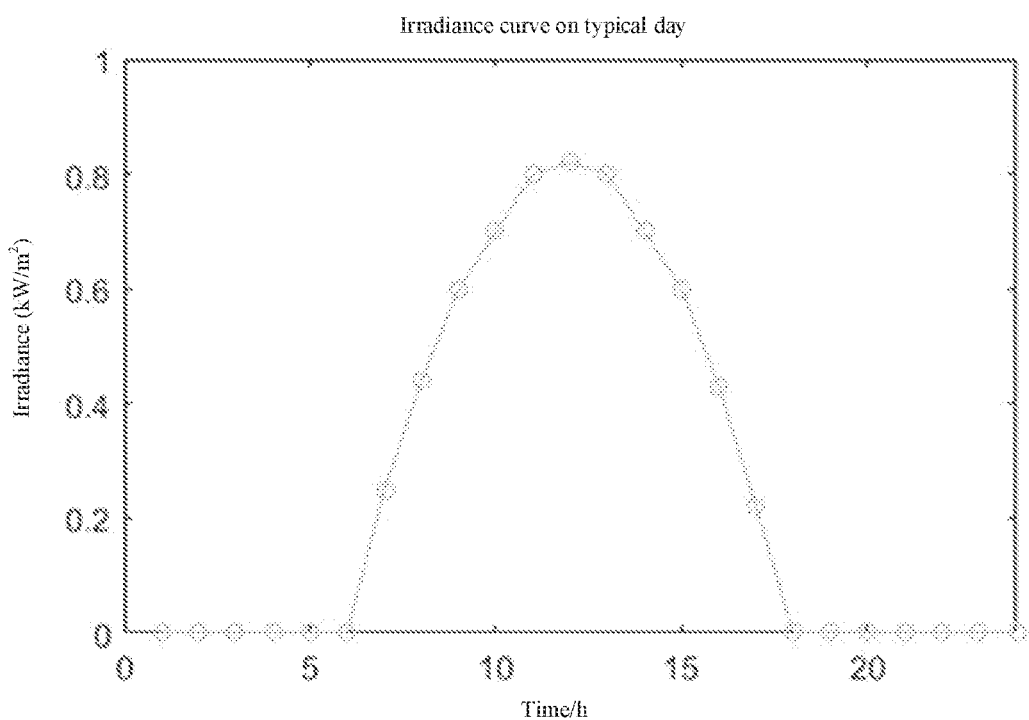
FIG. 7 is an irradiance curve on a typical day according to an embodiment of the present application.
Figure 8:
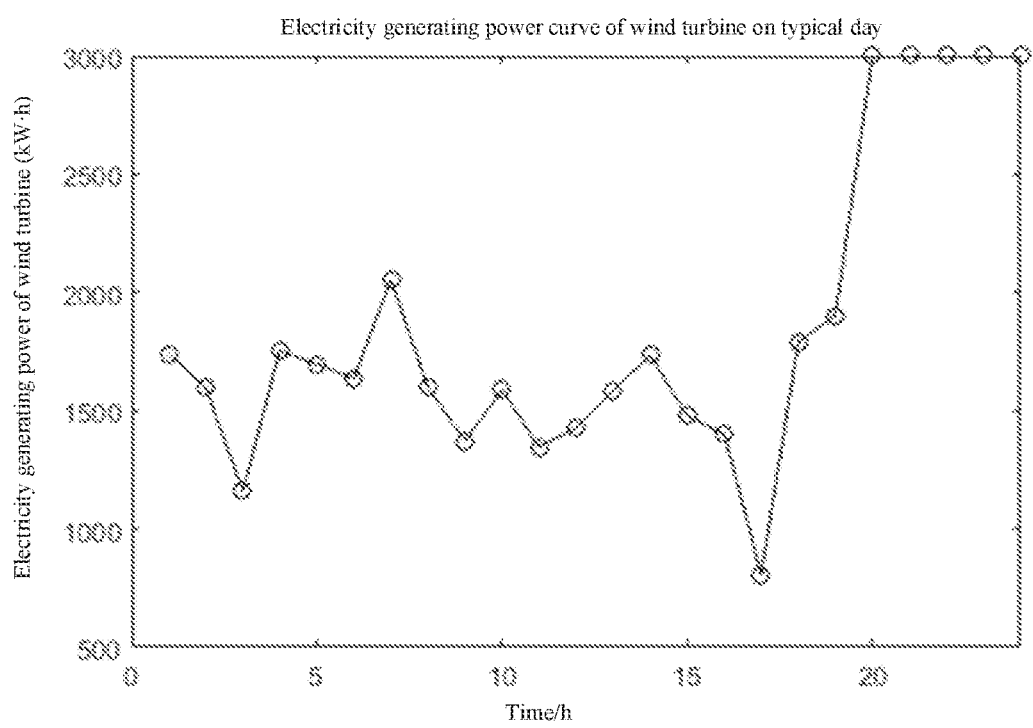
FIG. 8 is an electricity generating power curve of a wind turbine unit on a typical day according to an embodiment of the present application.
Figure 9:
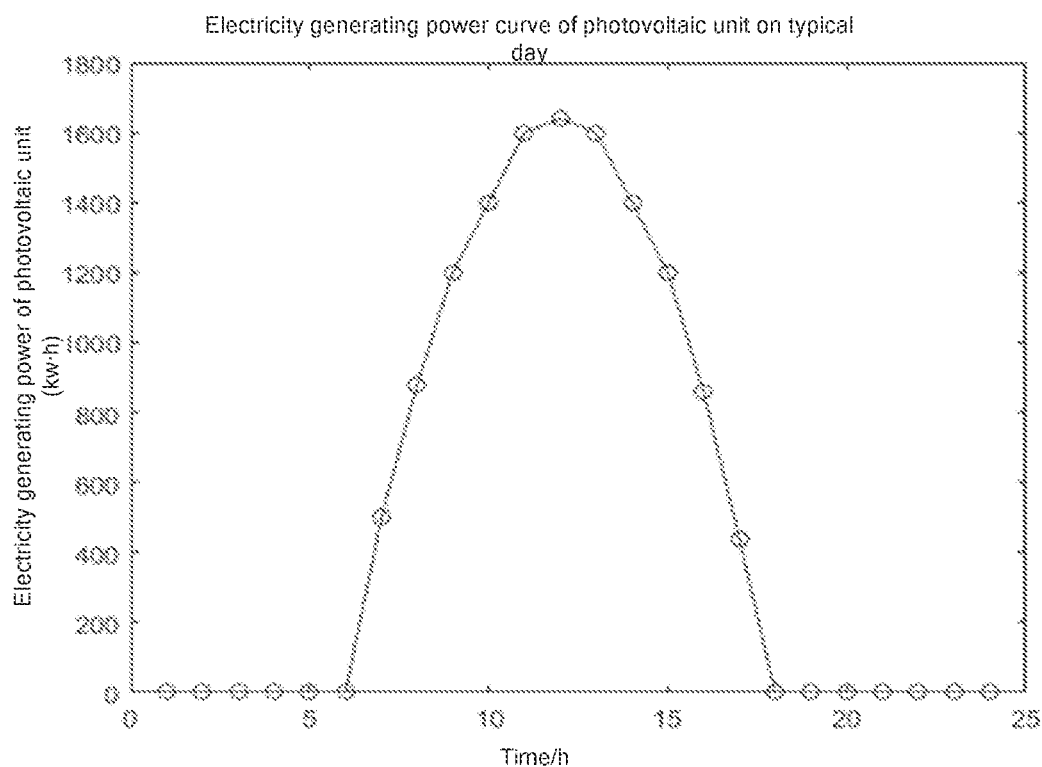
FIG. 9 is an electricity generating power curve of a photovoltaic unit on a typical day according to an embodiment of the present application.
Figure 10:
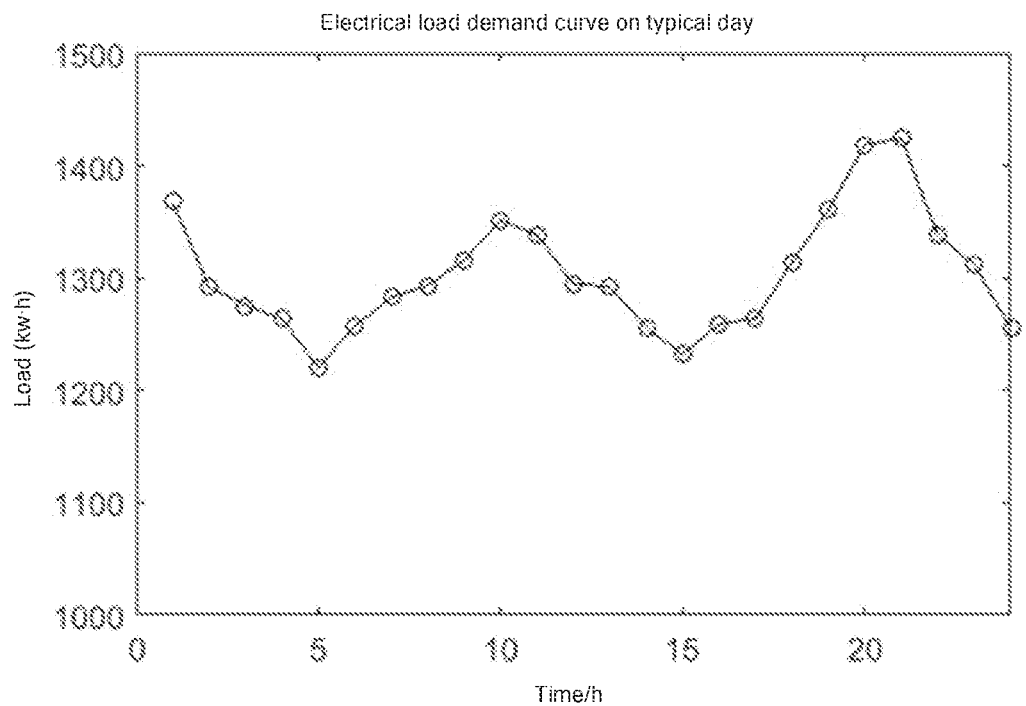
FIG. 10 is an electrical load demand curve on a typical day according to an embodiment of the present application.
Figure 11:
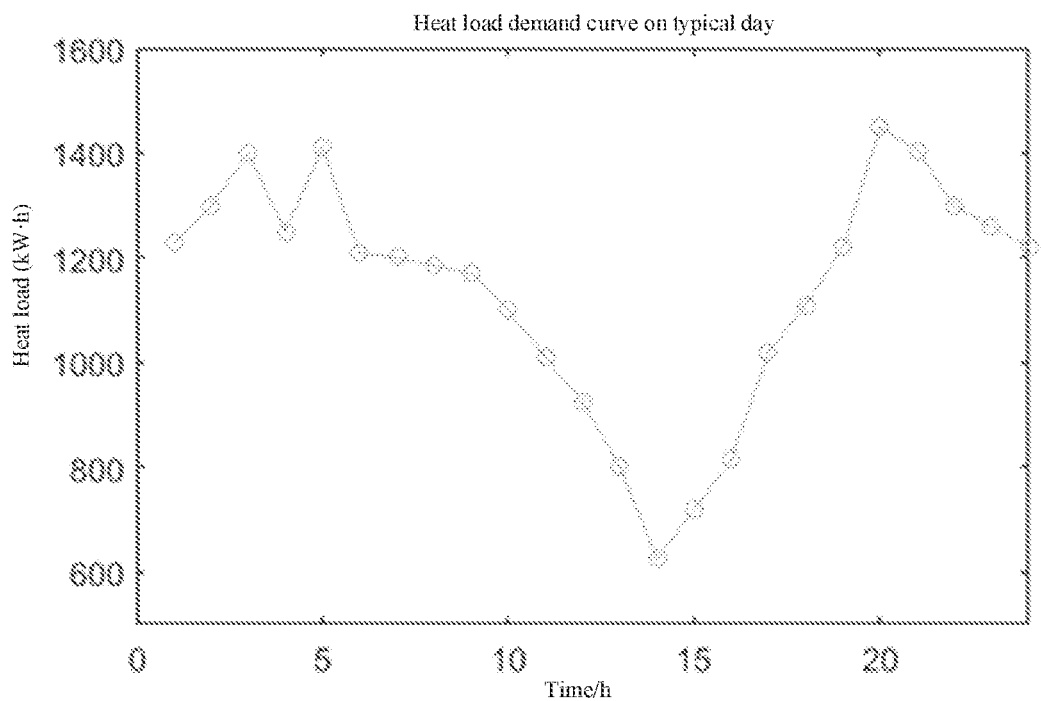
FIG. 11 is a heat load demand curve on a typical day according to an embodiment of the present application.
Figure 12:
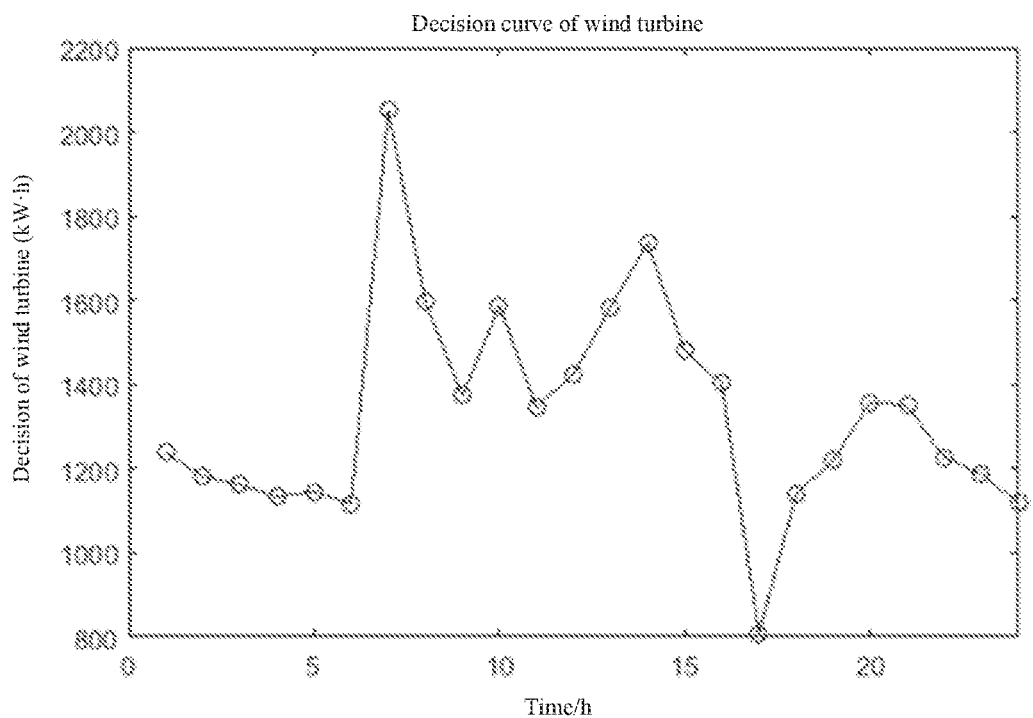
FIG. 12 is a decision curve of a wind turbine unit according to an embodiment of the present application.
Figure 13:
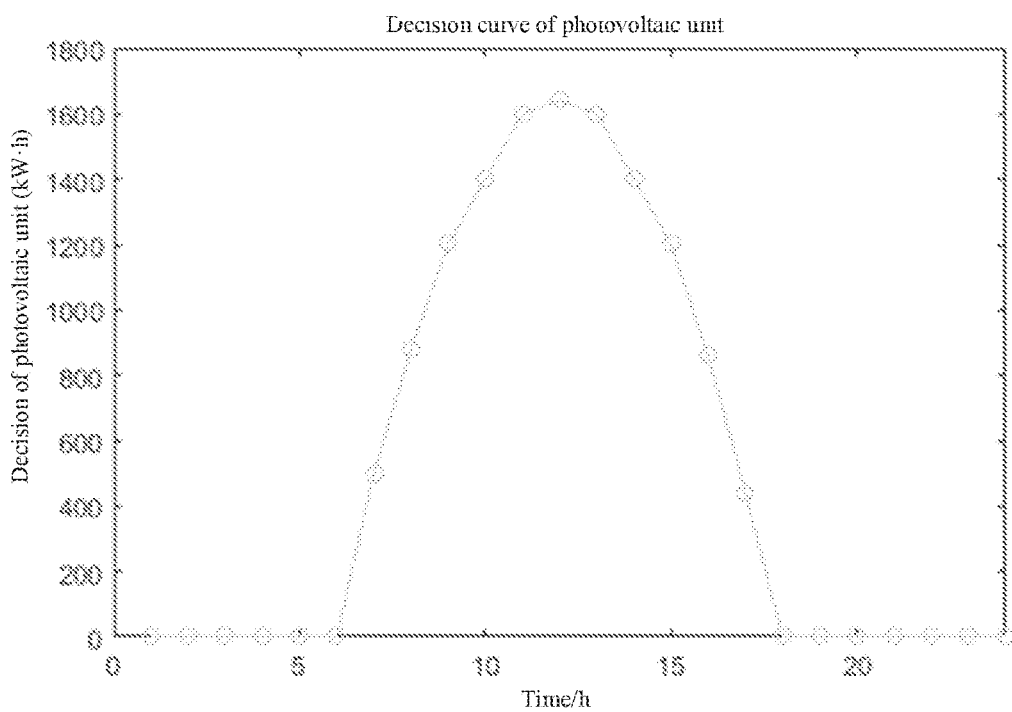
FIG. 13 is a decision curve of a photovoltaic unit according to an embodiment of the present application.

Taking the integrated electricity and heat system with heat pumps of the present application (as shown in FIG. 2) as an example, a wind turbine unit, a photovoltaic unit, a power storage system, a integrated electricity and heat unit, an heat pump and the like were provided. The installed capacity of the wind turbine unit was 3000 kW, the installed capacity of the photovoltaic unit was 2000 kW, the installed capacity of the power storage system was 1000 kW, and the installed capacity of the integrated electricity and heat unit was 400 kW. Taking one day T as 24 hours and each decision time as 1 hour, the wind speed and irradiance data on a typical day (as shown in FIGS. 6 and 7) were selected for analysis, and the output expressions of the wind turbine unit and the photovoltaic unit were combined to obtain the electricity generating power curve of the wind turbine unit and the electricity generating power curve of the photovoltaic unit on a typical day (as shown in FIGS. 8 and 9). The electrical load and heat load prediction curves on the selected typical day are shown in FIGS. 10 and 11.

The present application adopted the cyclic iterative computation of the particle swarm optimization algorithm, taking the acceleration constants $c_1$ and $c_2$ as 1.3, the allowable error A as 0.05%, the particle swarm size N as 100, and the maximum number of iterations as 100. Each unit in the system played a non-cooperative game with the objective of maximizing its own payoff function. The data of the corresponding working equipment and the electricity price involved in the example are shown in Table 1 and Table 2. In consideration of the actual situation, when selecting the available electricity supply power, the decision space was discrete, and the electricity supply decision of each unit must be an integer kW.

TABLE 1

Operating parameters of units

| Relevant parameter | Parameter value | Relevant parameter | Parameter value |
|---|---|---|---|
| Cut-in wind speed $v_i$ (m/s) | 3 | $SOC_{min}$ | 0.2 |
| Cut-out wind speed $v_o$ (m/s) | 20 | $SOC_{max}$ | 1 |
| Rated wind speed $v_r$ (m/s) | 12 | Energy efficiency coefficient x | 3 |
| Power derating factor $\alpha_{pv}$ | 0.8 | Electricity generation efficiency $\eta_p$ | 0.3539 |
| Standard irradiance $A_s$ | 1 | Heat supply efficiency $\eta_q$ | 0.8924 |
| Energy storage charge efficiency $\beta_c$ | 0.9 | Electro-thermal conversion coefficient $\alpha_{chp}$ | 0.2 |
| Energy storage discharge efficiency $\beta_d$ | 0.9 | Unit cost of coal $c_f$ (yuan/t) | 500 |

TABLE 2

Other relevant parameters

| Relevant parameter (yuan/kWh) | Parameter value | Relevant parameter (yuan/kWh) | Parameter value |
|---|---|---|---|
| Price of sold electricity $C_{sell,t}$ | 0.65 | Allowance of photovoltaic unit $C_{pvsu}$ | 0.6 |
| Allowance of wind turbine unit $C_{wsu}$ | 0.2 | Price of sold heat $C_{sell-Q,t}$ | 0.35 |
| Maintenance factor of wind turbine unit $K_{wm}$ | 30 | Maintenance factor of photovoltaic unit $K_{pvm}$ | 45 |
| Power output maintenance factor of thermoelectric subsystem $K_{sm1}$ | 0.2 | Heat output maintenance factor of thermoelectric subsystem $K_{sm2}$ | 0.1 |
| Penalty factor for wind curtailment $\mu_w$ | 0.0054 | Penalty factor for solar curtailment $\mu_{pv}$ | 0.0088 |

Based on the specific data in the example simulation, modeling is performed for the electricity supply decision problem of the integrated electricity and heat system with heat pumps by applying the above model, and calculation was performed in MATLAB. In the non-cooperative game model, the results of electricity supply decision and heat supply decision of each unit agent solved on some typical day are shown in FIGS. 12-16.

Under the equilibrium solution of the non-cooperative game, the payoff results of the units were: the total payoff of the wind turbine unit on the typical day was 18830.563 yuan; the total payoff of the photovoltaic unit on the typical day was 6159.171 yuan; and the total payoff of the integrated electricity and heat unit on the typical day was 9639.859 yuan.

Figure 14:
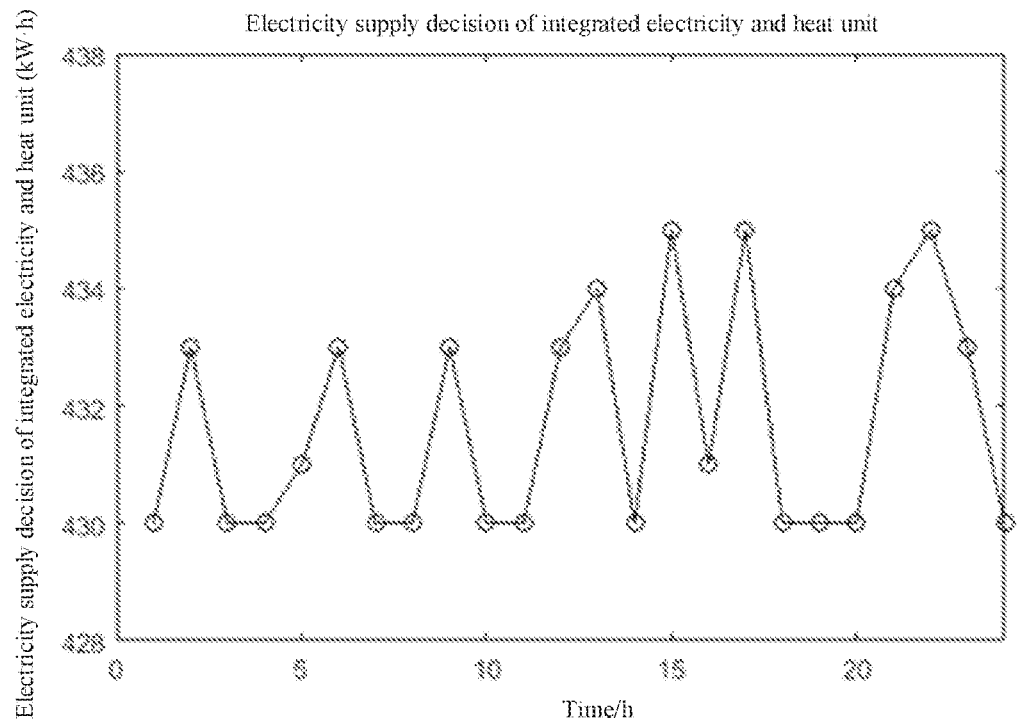
FIG. 14 is an electricity supply decision curve of a integrated electricity and heat unit according to an embodiment of the present application.
Figure 15:
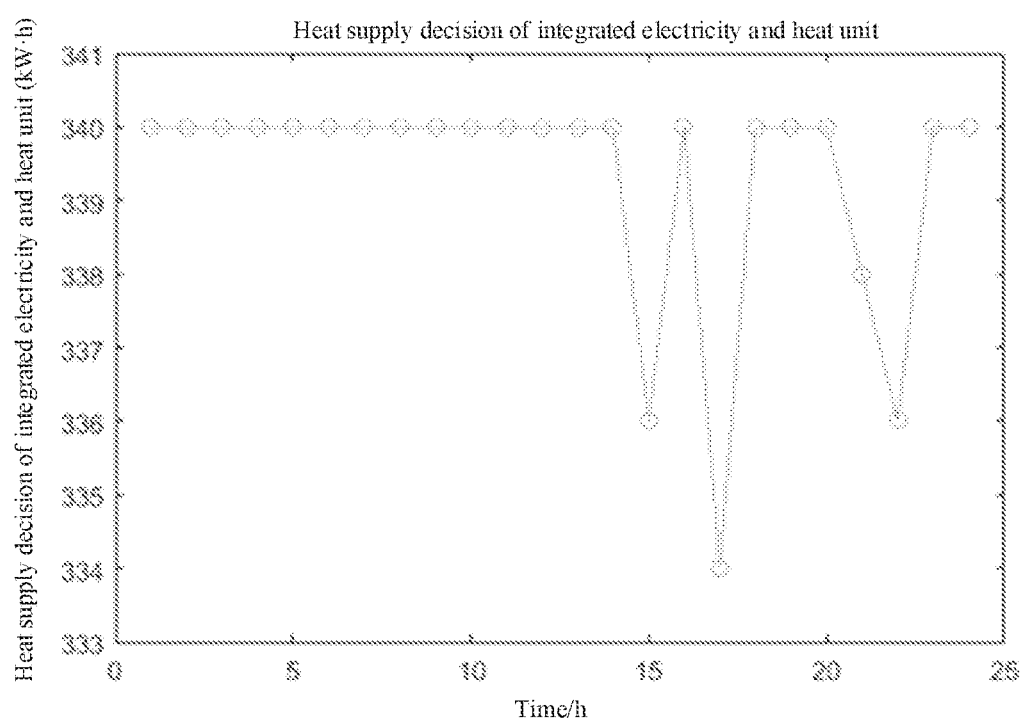
FIG. 15 is a heat supply decision curve of a integrated electricity and heat unit according to an embodiment of the present application.
Figure 16:
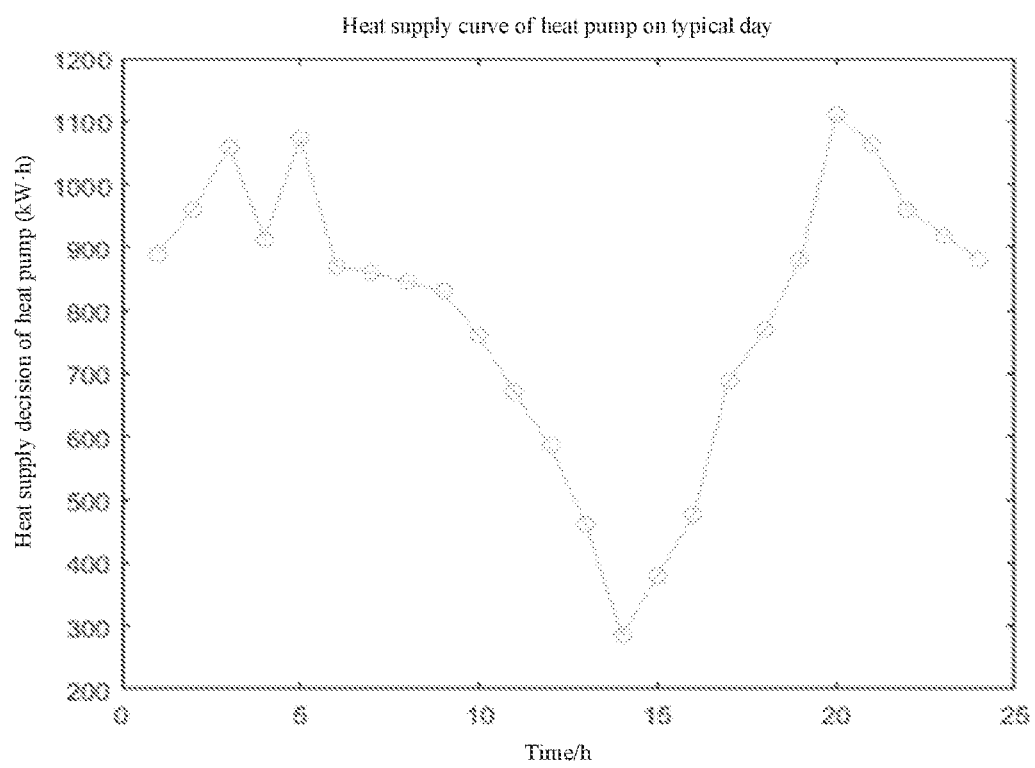
FIG. 16 is a heat supply curve of an heat pump according to an embodiment of the present application.

It can be known from FIGS. 14 and 15 that since the integrated electricity and heat unit in the system will operate in the mode of "determining generating capacity based on heat load", the heat load is firstly met, which limits its peak load regulating and controlling capacity of power, so the electricity supply decision is relatively stable. However, the integrated electricity and heat unit operates in a coordinated and complementary manner with the wind turbine unit and the photovoltaic unit. In order to obtain more payoffs, the wind turbine unit and the photovoltaic unit will provide as much available electricity as possible. However, if the value is too high, it will increase the maintenance cost of the unit and the amount of wind and solar curtailment, and the penalty cost of the integrated electricity and heat unit will increase accordingly. The integrated electricity and heat unit, in order to maximize its own interest, will minimize the phenomenon of wind and solar curtailment, so that a situation of mutual game playing is formed. As shown in FIG. 16, when the heat supply output of the integrated electricity and heat unit is insufficient, the insufficient heat energy will be supplied by the heat pump, but the heat supply of the heat pump in the system needs doing work by increasing the electricity supply by the integrated electricity and heat unit.

The present application has the following advantages:

(1) according to the present application, optimization is performed no longer by regarding all the units in the integrated electricity and heat system with heat pumps as a whole, instead by regarding the units as different agents and taking maximization of the self-interest of each agent as the objective. Therefore, a non-cooperative game model of heat and power scheduling is established by viewing the multi-agent decision optimization problem based on the idea of game theory and considering the interactions among the agents, which is conductive to coping with the diversity of the agents of the integrated electricity and heat system with heat pumps; and (2) according to the present application, a particle swarm optimization algorithm is combined with an iterative algorithm to solve the game model. The particle swarm optimization algorithm simulates the process of each agent searching for the optimal solution under given conditions, and the iterative algorithm simulates the response of each agent to decision changes of other agents. The optimal scheme of output scheduling of each unit can be determined through the obtained Nash equilibrium solution strategy, thereby providing guidance for the heat and power scheduling decision. The output scheme can not only meet the load demands of heat and power consumers, but also satisfy all the agents.

The optimized regulating and controlling method and system for an integrated electricity and heat system with heat pumps provided by the embodiments of the present application are described in detail above. The description of the above embodiments is only used to help understand the method and core concept of the present application. At the same time, for those of ordinary skill in the art, according to the concept of the present application, there will be changes in the specific implementation and the scope of application. In summary, the content of this description should not be construed as a limitation to the present application.

Certain words are used in this description and claims to refer to specific components. Those skilled in the art should understand that hardware manufacturers may use different terms to refer to the same component. This description and claims do not use differences in names as a way to distinguish components, but use differences in functions of components as criteria for distinction. For example, "include" or "comprise" mentioned in the entire description and claims is an open-ended term, so it should be interpreted as "include/ comprise, but not limited to". "Approximately" means being within an acceptable error range. Those skilled in the art can solve the technical problem within a certain error range, and basically achieve the technical effect. The subsequent description of this description is a preferred implementation for implementing the present application, but the description is for the purpose of illustrating the general principles of the present application and is not intended to limit the scope of the present application. The protection scope of the present application shall be subject to those defined in the appended claims.

It should also be noted that the term "comprise", "include" or any other variant thereof is intended to cover non-exclusive inclusion, so that a commodity or system that includes a series of elements includes not only those elements, but also other elements that are not explicitly listed, or also include elements inherent to the commodity or system. In the case where there are no more limitations, the element defined by the sentence "including a . . . " does not exclude the existence of other identical elements in the commodity or system that includes the element.

It should be understood that the term "and/or" used herein is only an association relationship describing associated objects, and indicates that there may be three relationships, for example, A and/or B can indicate: A exists alone, A and B exist at the same time, and B exists alone. In addition, the character "/" herein generally indicates that the associated objects before and after are in an "or" relationship.

The above description shows and describes several preferred embodiments of the present application. However, as mentioned above, it should be understood that the present application is not limited to the form disclosed herein and should not be regarded as an exclusion to other embodiments, but can be used in various other combinations, modifications and environments and can be modified through the above teachings or technology or knowledge in related fields within the scope of the application concept described herein. The modifications and changes made by those skilled in the art without departing from the spirit and scope of the present application should fall within the protection scope of the appended claims of the present application.

What is claimed is:

1. An optimized regulating and controlling method for an integrated electricity and heat system, the integrated electricity and heat system comprising a power network, a wind turbine unit, a photovoltaic unit, a power storage system, a thermoelectric subsystem comprising a heat and power unit and a heat pump, wherein the power network is configured to receive outputs from the wind turbine unit, the photovoltaic unit, the power storage system, the heat and power unit, and to output power to the heat pump and consumer of power, and wherein the thermoelectric subsystem configured to output heat to consumer of heat,
wherein the method comprises the following steps:
S1: establishing a composition and structure framework of the integrated electricity and heat system, and establishing an output model of each unit, wherein each unit is selected from the wind turbine unit, the photovoltaic unit, the power storage system, the heat and power unit, and the heat pump;
S2: establishing a payoff function model of each unit in the integrated electricity and heat system;
S3: establishing a non-cooperative game model of the integrated electricity and heat system;
S4: solving the game model by using a particle swarm optimization algorithm to obtain a heat and power scheduling optimization scheme of each unit;
wherein the output model of the wind turbine unit is:

$$P_{w,t} = \begin{cases} 0 & v_t < v_i, v_t > v_o \\ \dfrac{P_{wz}(v_t - v_i)}{v_r - v_i} & v_i \leq v_t \leq v_r \\ P_{WZ} & v_r \leq v_t \leq v_o \end{cases};$$

wherein $v_t$ is real-time wind speed at time t, $v_i$ is cut-in wind speed of the wind turbine unit, $v_o$ is cut-out wind speed of the wind turbine unit, $v_r$ is rated wind speed of the wind turbine unit, and $P_{wz}$ is installed capacity value of the wind turbine unit;
wherein the payoff function model of the wind turbine unit is:

$$I_w = I_{wsell} + I_{wa} - I_{wm};$$

wherein $I_w$ is payoff of the wind turbine unit, $I_{wsell}$ represents revenue of sold electricity of the wind turbine unit, $I_{wa}$ represents allowance revenue of the wind turbine unit, and $I_{wm}$ represents maintenance cost of the wind turbine unit;
wherein the output model of the photovoltaic unit is:

$$P_{pv,t} = \alpha_{pv} P_{PVZ} \dfrac{A_t}{A_s}[1 + \alpha_T(T - T_{stp})];$$

wherein $\alpha_{pv}$ is power derating factor of the photovoltaic unit, $P_{PVZ}$ is installed capacity of the photovoltaic unit, $A_t$ is actual irradiance of the photovoltaic unit at time t, $A_s$ is irradiance under standard conditions, $\alpha_T$ is power temperature coefficient, $T_{stp}$ is temperature under standard conditions, and T is real-time temperature;
wherein the payoff function model of the photovoltaic unit is:

$$I_{pv} = I_{pvsell} + I_{pva} - I_{pvm};$$

wherein $I_{pv}$ is payoff of the photovoltaic unit, $I_{pvsell}$ represents revenue of sold electricity of the photovoltaic unit, $I_{pva}$ represents allowance revenue of the photovoltaic unit, and $I_{pvm}$ represents maintenance cost of the photovoltaic unit;
wherein the output model of the heat and power unit is:

$$P_{pc,t} = P_{chp,t} + \alpha_{chp} Q_{chp,t};$$

wherein $P_{pc,t}$ is electric power of a pure condensing condition at time t, $P_{chp,t}$ is electric power of the heat and power unit at time t, $Q_{chp,t}$ is thermal power of the heat and power unit at time t, and $\alpha_{chp}$ is electro-thermal conversion coefficient;
wherein the payoff function model of the heat and power unit is:

$$I_{chp} = I_{ssell} - I_{sf} - I_{sm} - I_{sa};$$

wherein $I_{chp}$ is payoff of the heat and power unit, $I_{ssell}$ is revenue of sold electricity and heat of the heat and power unit, $I_{sf}$ is fuel cost of the heat and power unit, $I_{sm}$ is maintenance cost of the heat and power unit, and $I_{sa}$ represents cost of wind and solar curtailment that the heat and power unit needs to afford;

wherein the output model of the heat pump is:

$$\chi = \frac{Q_U}{W}, Q_{pu} = \chi \cdot P_{pu};$$

wherein $\chi$ is heat supply efficiency of the heat pump, $Q_U$ is heat energy converted by the heat pump, W is electric energy consumed by the heat pump, $Q_{pu}$ is heating capacity of the heat pump, and $P_{pu}$ is input power of the heat pump;

wherein the output model of the heat pump is related to the output model of the heat and power unit according to $$P_{chp,t} = P_{chps,t} + P_{pu,t}$$

$P_{chps,t}$ is electric power of the heat and power unit at time t outputted to the consumer of power and $P_{pu,t}$ is the input power of the heat pump at time t;

wherein the process of solving the game model by using the particle swarm optimization algorithm comprises:

S41: initializing equipment operating parameters and limit parameters, and setting constraints of the upper and lower limits of the parameters;

S42: setting the initial value ($P_{wc,0}$, $P_{pve,0}$, $P_{chp,0}$, $Q_{chp,0}$) of the equilibrium point;

S43: performing optimization on game participants independently according to a certain order;

S44: the optimization result of the i-th round is ($P_{wc,i}$, $P_{pvc,i}$, $P_{chp,i}$, $Q_{chp,i}$), then the optimization result obtained after the (i+1)-th round of iterative optimization is ($P_{wc,i+1}$, $P_{pvc,i+1}$, $P_{chp,i+1}$, $Q_{chp,i+1}$), and the following relationships are met:

$$P_{wc,i+1} = \arg\max_{P_{wc}} I_w(P_{wc,i}, P_{pvc,i}, P_{chp,i}, Q_{chp,i}),$$

$$P_{pvc,i+1} = \arg\max_{P_{pvc}} I_{pv}(P_{wc,i}, P_{pvc,i}, P_{chp,i}, Q_{chp,i}),$$

$$(P_{chp,i+1}, Q_{chp,i+1}) = \arg\max_{P_{chp}, Q_{chp}} I_{chp}(P_{wc,i}, P_{pvc,i}, P_{chp,i}, Q_{chp,i}),$$

wherein $P_{wc,i}$ and $P_{pvc,i}$ represent respectively the available electricity supply power of the wind turbine unit and the photovoltaic unit after the i-th round of optimization, $P_{chp,i}$ and $Q_{chp,i}$ represent respectively the available electricity supply power and the available heat supply power of the thermoelectric subsystem; and S45: confirming whether the obtained result is a Nash equilibrium solution; and if yes, completing the solving, otherwise, returning to S43, wherein the heat and power scheduling optimization scheme generates an available electricity supply of the wind turbine unit, an available electricity supply power of the photovoltaic unit, an available electricity supply power of and an available heat supply power of the thermoelectric subsystem corresponding to the Nash equilibrium solution, operating the wind turbine unit at the available electricity supply power thereof, operating the photovoltaic unit at the available electricity supply power thereof, and operating the heat supply power of the thermoelectric subsystem according to the available electricity supply power and the available heat supply power thereof, wherein the establishment of the game model in S3 takes supply and demand balance of power and heat and unit operating conditions as constraints and maximization of interests of each agent in the integrated electricity and heat system as an optimization objective.

2. The optimized regulating and controlling method for the integrated electricity and heat system according to claim 1, wherein the output model of the power storage system is:

$$C_{e,t+1} = \begin{cases} (1-\alpha)C_{e,t} - \beta_c P_{e,t}\Delta t & P_{e,t} \leq 0, \\ (1-\alpha)C_{e,t} - \frac{1}{\beta_d}P_{e,t}\Delta t & P_{e,t} > 0; \end{cases}$$

wherein $C_{e,t+1}$ is remaining power of a storage battery at time t+1, $C_{e,t}$ is remaining power of the storage battery at time t, a is self-discharge efficiency of the storage battery, $\beta_c$ and $\beta_d$ are charge efficiency and discharge efficiency of the storage battery, respectively, $P_{e,t}$ is charge/discharge power of the storage battery, and $\Delta t$ is charge/discharge duration.

3. An optimized regulating and controlling device for an integrated electricity and heat system, wherein the device is used to implement the regulating and controlling method according to claim 1, the device comprises a control module and a communication module; the communication module is separately connected to each unit of the integrated electricity and heat system, and configured to acquire data of each unit and send regulating and controlling instructions to each unit; and the control module is configured to store an output model, a payoff function model, constraint conditions and a game model of each unit and solve the game model of each unit to obtain an optimal regulating and controlling scheme.

* * * * *